(12) United States Patent
Eguchi et al.

(10) Patent No.: US 8,432,752 B2
(45) Date of Patent: Apr. 30, 2013

(54) ADAPTIVE WRITE PROCEDURES FOR NON-VOLATILE MEMORY USING VERIFY READ

(75) Inventors: Richard K. Eguchi, Austin, TX (US); Chen He, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 122 days.

(21) Appl. No.: 13/169,989

(22) Filed: Jun. 27, 2011

(65) Prior Publication Data

US 2012/0327720 A1    Dec. 27, 2012

(51) Int. Cl.
*G11C 7/00* (2006.01)
(52) U.S. Cl.
USPC ............. 365/189.16; 365/185.22; 365/185.29
(58) Field of Classification Search ............. 365/189.16, 365/185.22, 185.29, 201
See application file for complete search history.

(56) References Cited

U.S. PATENT DOCUMENTS

| | | | |
|---|---|---|---|
| 5,801,987 A | 9/1998 | Dinh | |
| 5,991,201 A | 11/1999 | Kuo et al. | |
| 6,574,147 B2 * | 6/2003 | Tanaka et al. | 365/185.22 |
| 6,956,771 B2 | 10/2005 | Sarig et al. | |
| 7,006,379 B2 * | 2/2006 | Noguchi et al. | 365/185.17 |
| 7,079,424 B1 | 7/2006 | Lee et al. | |
| 7,088,620 B2 | 8/2006 | Kawai et al. | |
| 7,173,859 B2 | 2/2007 | Hemink | |
| 7,177,199 B2 | 2/2007 | Chen et al. | |
| 7,224,617 B2 * | 5/2007 | Takeuchi | 365/185.25 |
| 7,262,998 B2 | 8/2007 | Moogat et al. | |
| 7,675,780 B2 | 3/2010 | Lee et al. | |
| 8,009,481 B2 | 8/2011 | Nirschl | |

OTHER PUBLICATIONS

U.S. Appl. No. 13/023,713, Inventor Jon S. Choy, et al, "Erase Ramp Pulse Width Control for Non-Volatile Memory", filed Feb. 9, 2011.
U.S. Appl. No. 13/170,009, Chen He, "Adaptive Write Procedures for Non-Volatile Memory", filed Jun. 27, 2011, Office Action—Rejection—mailed Dec. 6, 2012.

* cited by examiner

*Primary Examiner* — Son Dinh
(74) *Attorney, Agent, or Firm* — Mary Jo Bertani; James L. Clingan, Jr.

(57) ABSTRACT

A method includes performing a write operation on memory cells of a memory array to a first logic state using a voltage of a charge pump. A portion of the write operation is performed on the memory cells of the memory array using the voltage of the charge pump. A determination is made if the voltage insufficient for performing the write operation on the memory cells of the memory array. If a level of the voltage is insufficient, the write operation is continued with an increased level of the voltage by reducing load on the charge pump by providing the voltage on a reduced number of memory cells. The reduced number of memory cells is a first subset of the memory cells.

20 Claims, 7 Drawing Sheets

ADAPTIVE WRITE PROCEDURES FOR NON-VOLATILE MEMORY USING VERIFY READ

CROSS-REFERENCE TO RELATED APPLICATION(S)

This application is related to U.S. patent application Ser. No. 13/170,009, filed on even date, entitled "Adaptive Write Procedures For Non-Volatile Memory," naming Chen He and Richard Eguchi as inventors, and assigned to the current assignee hereof.

BACKGROUND

1. Field of the Disclosure

The present disclosure relates in general to non-volatile memories, and more specifically to a system and method for adaptively programming and erasing non-volatile memory.

2. Description of the Related Art

During a typical erase operation of a non-volatile memory (NVM) block, such as electrically erasable programmable read only memories (EPROMs), electrically erasable programmable read only memories (EEPROMs), block erasable EEPROMs (e.g., "Flash" memories), etc., a preprogram procedure is performed to raise the threshold voltages of the memory cells of the memory block to a level at or above a program verify voltage. For the erase operation, the preprogram procedure is followed by a Fowler-Nordheim (FN) erase procedure to lower the threshold voltages of the memory cells of the memory block to a level at or below an erase verify voltage. During the conventional FN erase procedure, however, the resulting distribution may include memory cells which have been over erased, which results in increased column leakage. Furthermore, the problem of column leakage increases as the memory cells are further scaled, causing, for example, a subsequent program procedure to fail due to lowered drain bias, or a read procedure to fail since the over-erased memory cells may prevent sense amplifiers from distinguishing between an erased cell and a programmed cell. A soft program procedure may be used after the FN erase procedure to compress the distribution of the erased cells so as to reduce the column leakage.

As the technology and feature size of the memory cells become smaller and operating temperatures increase, device leakage is a significant challenge which must be managed to guarantee flash erase and program performance and reliability. Device leakage increases exponentially at higher temperatures, which causes more load on the circuitry within the NVM module and causes performance degradation. Additionally, there is less signal to noise immunity at low voltage due to low voltage drive strength roll-off. With smaller geometries, the transconductance degradation of the memory cell with cycling becomes significant causing a need to manage increasing column leakage throughout the lifetime of the part. For erase procedures, increased high voltage device leakage causes significant loading on the charge pump causing the memory cells to receive very inefficient erase pulse bias levels and may result in a failure to erase. For program procedures, the increased column leakage causes significant loading on the drain charge pumps causing the memory cell to receive very inefficient program pulse bias levels and may result in a program failure.

BRIEF DESCRIPTION OF THE DRAWINGS

The benefits, features, and advantages of the present disclosure will become better understood with regard to the following description, and accompanying drawings where.

DETAILED DESCRIPTION

The following description is presented to enable one of ordinary skill in the art to make and use the present disclosure as provided within the context of a particular application and its requirements. Various modifications to the preferred embodiment will, however, be apparent to one skilled in the art, and the general principles defined herein may be applied to other embodiments. Therefore, the present disclosure is not intended to be limited to the particular embodiments shown and described herein, but is to be accorded the widest scope consistent with the principles and novel features herein disclosed.

Systems and methods are disclosed that reduce device leakage and load during erase or program procedures by reducing the number of bits to be programmed or erased in parallel, i.e., subset program or erase. For instance, one example of subset erase is to split an NVM array in half, and erase one half at a time. Currently such subset program and erase features can only be enabled statically and will incur a performance penalty even when the subset program/erase is not needed (e.g., at room temp or on parts without much device leakage due to better process). Therefore, subset program and erase is adaptively enabled when needed (e.g., at higher temperatures and/or via part wearing) to maximize part performance and reliability throughout the lifetime of the device.

Figure 1:
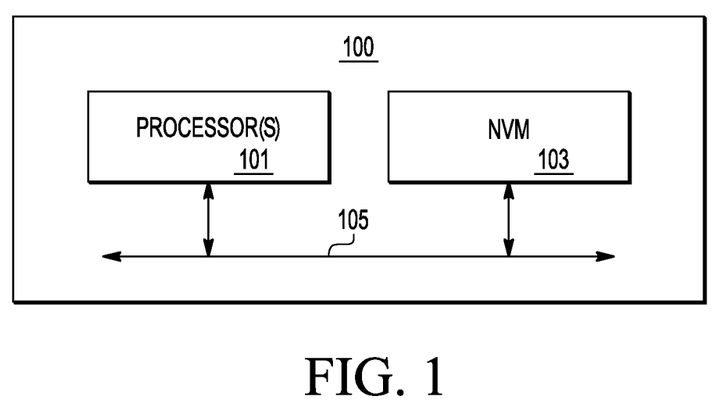
FIG. 1 is a block diagram of an integrated circuit including a non-volatile memory (NVM) according to one embodiment.

FIG. 1 is a block diagram of an integrated circuit 100 including a non-volatile memory (NVM) 103 according to one embodiment. In the illustrated embodiment, the integrated circuit (IC) 100 may implement a system on a chip (SOC) or the like which includes at least one processor 101 coupled to the NVM 103 via an appropriate interface 105, such as a bus or the like with multiple signals or bits. The IC 100 may include other circuits, modules or devices, such as other memory devices (not shown), other functionally modules (not shown), and external interfaces, such as input, output or input/output (I/O) ports or pins or the like (not shown). In one alternative embodiment, the NVM 103 is integrated on the IC 100 alone without any other devices. In another alternative embodiment, the processor 101, NVM 103 and interface 105 are part of a larger system on the IC 100.

Figure 2:
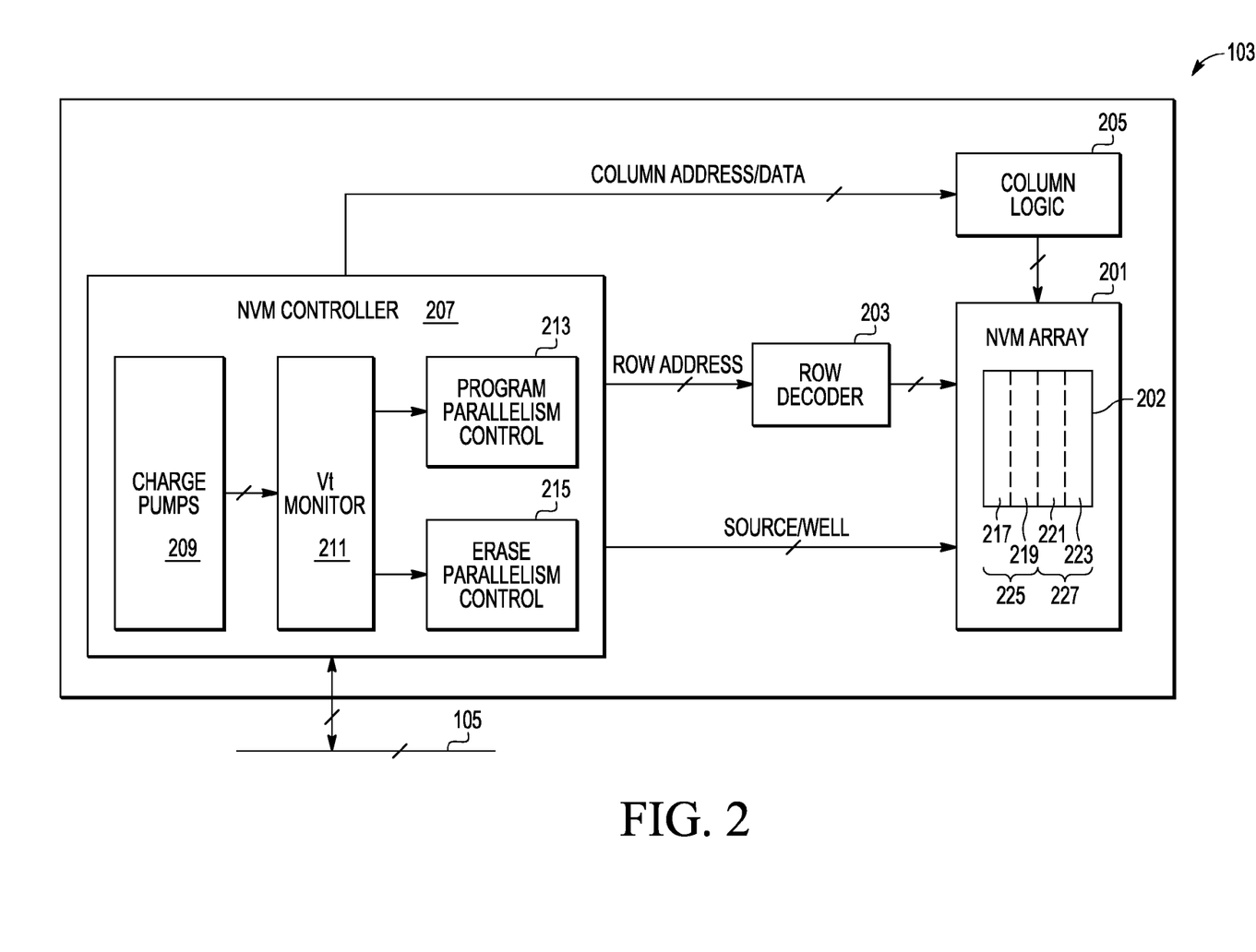
FIG. 2 is a more detailed block diagram of the NVM according to one embodiment coupled to the interface of FIG. 1.

FIG. 2 is a more detailed block diagram of the NVM 103 according to one embodiment coupled to the interface 105. The NVM 103 includes an NVM array 201, a row decoder 203 coupled to the NVM array 201, column logic 205 coupled to the NVM array 201, and a NVM controller 207 coupled to the interface 105, the NVM array 201, the column logic 205, and the row decoder 203. The column logic 205 incorporates a column decoder and sense amplifiers (not shown) and each interface is shown with multiple signals or bits. The NVM controller 207 controls procedure of the NVM array 201 through the row decoder 203 and the column logic 205, such as in response to the processor(s) 101 as communicated through the interface 105 or other interfaces. The NVM controller 207 accesses memory cells within the NVM array 201 by providing a row address to the row decoder 203 and a column address to the column logic 205. Data is written into or read from the NVM array 201 via the column logic 205. The NVM controller 207 also drives source and well voltages (via corresponding switches and controllers, not shown) to the NVM array 201.

Shown within NVM controller 207 are charge pumps 209, threshold voltage (Vt) monitor 211, program parallelism control logic 213, and erase parallelism control logic 215. Charge pumps 209 can include a negative charge pump that provides erase gate voltage, a positive charge pump that provides program gate voltage and erase pwell voltage, and a drain pump that provides program drain voltage. The output data from the column logic 205 at a predefined Vt verify read level is provided to the Vt monitor 211. The Vt monitor 211, program parallelism control logic 213, and erase parallelism control logic 215 adaptively adjusts the number of memory cells that are programmed/erased in parallel by monitoring an intermediate Vt verify read after a predetermined number of program/erase pulses. If the verify read fails, the number of memory cells being erased or programmed in parallel is decreased to decrease leakage and load and allowing the charge pumps to achieve target bias levels for program/erase, as further described herein in the description of FIGS. 3 and 5.

The NVM array 201 incorporates one or more blocks of memory cells in which each memory block has a selected block size, such as, for example, 16 kilobytes (kB), 32 kB, 64 kB, 128 kB, 256 kB, etc. Memory cells in NVM array 201 typically have a gate (G) terminal, a drain (D) terminal and a source (S) terminal along with isolated wells including a pwell (PW) and an nwell (NW). In one embodiment, each memory block is organized into rows and columns of the memory cells. The gate terminal of each row of memory cells is coupled to a corresponding one of multiple wordlines coupled to the row decoder 203. The drain terminal of each column of memory cells is coupled to a corresponding one of multiple bit lines coupled to the column logic 205. The source terminal and wells (PW and NW) of each memory cell are driven or controlled by the NVM controller 207.

As shown, the NVM array 201 includes at least one memory block 202 that is configured to allow program and erase procedures to be performed with adaptively adjustable or configurable parallelism. For instance, for erase operations, the memory block 202 is configured to allow an erase procedure to be performed on the entire block or just a subset of the memory block 202. Memory block 202 is shown with dashed lines for subsets 225, 227 each including half of the memory cells in memory block 202, and subsets 217, 219, 221, 223 each including one fourth of the memory cells in the memory block 202. Other subsets containing other numbers of the memory cells can be used, however.

As an example, erase procedures are bulk procedures that can be performed on all memory cells in a selected memory block 202. If the pwell voltage of the charge pumps 209 is not at predetermined value at a selected point of the erase operation, a subset of the memory cells can be selected for further erase procedures. This will reduce the load on the charge pumps and enable the charge pumps to output the intended pwell voltage. When the erase procedure is complete for the first subset, the erase procedure may be performed on a second subset of the memory cells.

As a further example, program procedures are performed on groups of memory cells in a selected memory block 202, such as groups of 18 memory cells at a time. If the drain bias voltage of the charge pumps 209 is not at predetermined value at a selected point of the program operation, a subset of the memory cells (e.g., 9, 6, or 3 memory cells) can be selected for further program procedures. This will reduce the load on the charge pumps and enable the charge pumps to output the intended drain voltage. When the program procedure is complete for the first subset, the program procedure may be performed on subsequent subsets of the memory cells.

The memory cells in memory array 201 can be implemented according to any one of several configurations, such as semiconductor configurations, layered silicon-metal nano crystals, etc. In one embodiment, each memory cell is implemented on a silicon substrate or the like. In one embodiment, the pwell of each memory cell is isolated from a P substrate with the nwell. A pair of n+ type doped regions (not shown) are formed in the pwell forming the drain and source terminals of each memory cell. Each memory cell further includes a stacked gate structure or the like, including an oxide layer (not shown) formed on the pwell, a floating gate (not shown) provided on the oxide layer, a dielectric layer (not shown) provided on the floating gate, and a control gate (not shown) provided on the dielectric layer forming a gate terminal. The pwell is generally coupled to a ground voltage Vss and the nwell is generally coupled to a source voltage Vdd except during FN erase pulses as described herein. The voltage level of Vdd depends upon the particular implementation.

In one embodiment, when an voltage pulse is applied to the memory cell during erase and program procedures as further described herein, the pwell and nwell of the memory cell are coupled or otherwise driven together to collectively receive a ramp pulse voltage. An "erase pulse" is said to be applied to each memory cell of the memory block 202 in which the gate terminal is driven to a selected erase pulse voltage and in which the pwell and nwell collectively receive an erase ramp pulse voltage which successively increases until the memory block is erased. The magnitude of the erase ramp pulse voltage applied to pwell and nwell is incrementally increased or otherwise ramped higher with each application of an erase pulse to the memory cells until the memory block 202 is erased. Thus, each erase pulse applied to the memory cells includes an erase pulse voltage applied to the gate terminal and an erase ramp pulse voltage applied to at least one well connection of the memory cells. A "program pulse" is said to be applied to a group of memory cell of the memory block 202 in which the gate terminal is driven to a selected program gate voltage and the drain terminal is driven to a selected program drain voltage. Program pulses will be applied to the group of memory cells until the group of memory cells are programmed, and such procedure can repeat for other memory cells in the memory block until the entire memory block is programmed.

The present disclosure is described using an exemplary NVM technology in which the erase ramp pulse voltage is applied to the pwells and nwells of the memory cells while the gate terminals receive an erase pulse voltage having a relatively fixed magnitude. In alternative embodiments, such as those using other NVM technologies and the like, the erase ramp pulse voltage is instead applied to a different connection or terminal of the memory cells being erased, such as the gate terminal or the like.

The present disclosure also is described using an exemplary NVM technology in which the program pulse voltage is applied to the gate of the memory cells while the drain terminals receive a different program pulse voltage having a relatively fixed magnitude. In alternative embodiments, such as those using other NVM technologies and the like, the program voltages are instead applied to a different connection or terminal of the memory cell being programmed.

Figure 3:
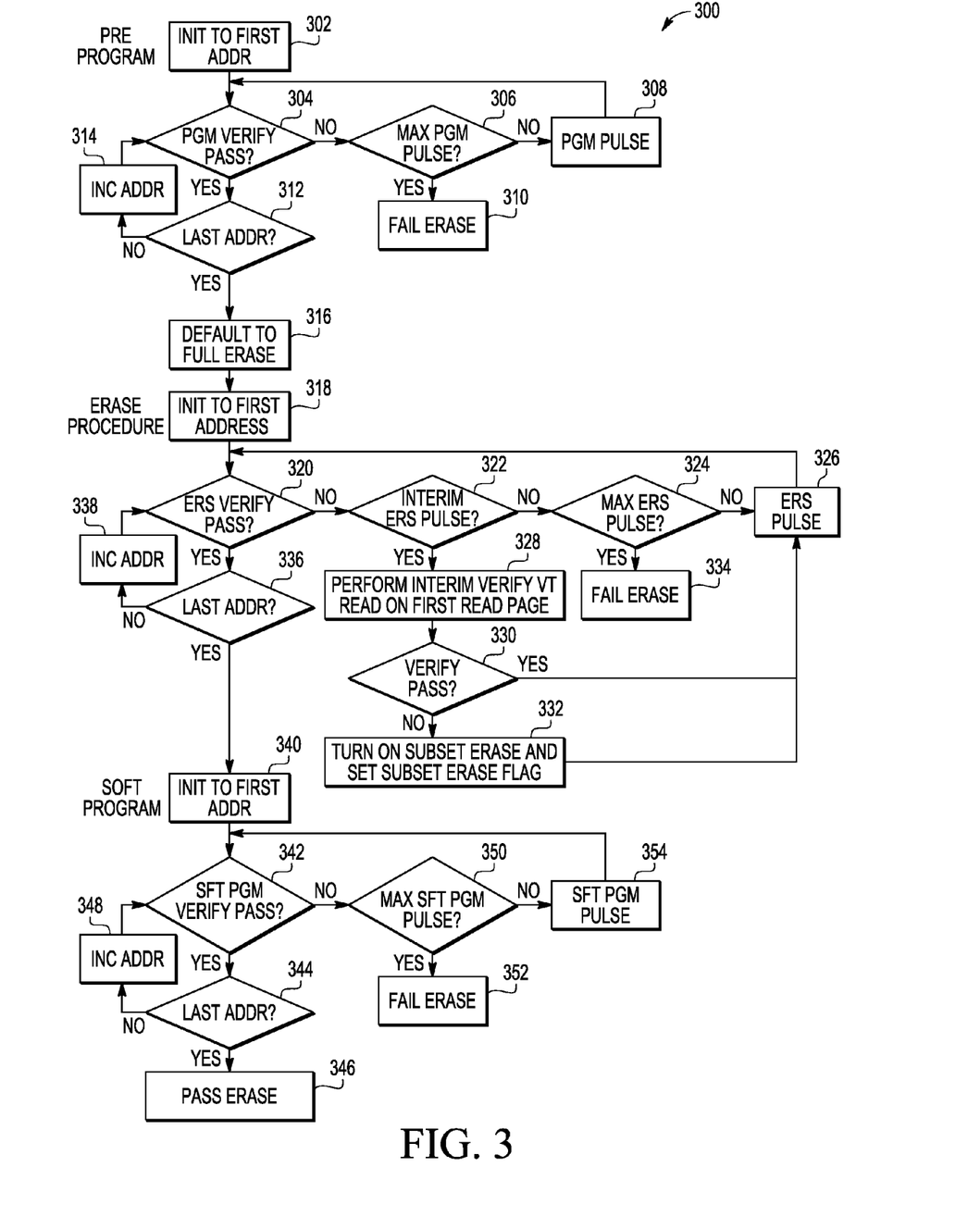
FIG. 3 is a flowchart diagram of an erase operation generally controlled by the NVM controller of FIG. 2 in accordance with one embodiment for the memory block within the NVM array of FIG. 2.

FIG. 3 is a flowchart diagram of an erase operation 300 generally controlled by the NVM controller 207 of FIG. 2 in accordance with one embodiment for the memory block 202 within the NVM array 201 of FIG. 2. The erase operation can include a pre-program procedure that includes processes 302-314, an erase procedure that includes processes 316-338, and a soft program procedure that includes processes 340-354.

During the pre-programming procedure, process 302 can include initializing a current row and column address to a first address in memory block 202. At process 304, a program (PGM) verify test is performed for the current address in the memory block 202. Although programming and verification may be performed on individual memory cells or subsets of memory cells, programming and verification is typically performed on a per-page basis in which each page includes a selected number of memory cells or bits, such as 128 bits or the like. A programming pulse may be applied to multiple memory cells or bits at a time, such as up to 18 bits. During the preprogram verify test, the Vt of each memory cell at the current address is compared with a program verify threshold (PVT) voltage. If the Vt of any memory cell at the current address is below the PVT voltage, operation proceeds to process 306 to determine whether the maximum number of program pulses have been applied. If the maximum number of program pulses have not been applied, operation proceeds to process 308 to apply the next program pulse to the memory cells below PVT, and then to process 304.

If process 306 determines that the maximum number of program pulses have been applied, process 310 indicates that the erase operation has failed.

Returning to process 304, if the program verify procedure passed at the current address (i.e., Vt of all memory cells at the address are at or above the PVT voltage, for example, 6V), process 312 determines whether the last address has been programmed. If the last address has not been programmed, process 314 increments the current address and returns operation to process 304. Otherwise, if the last address has been programmed, operation continues to process 316. Operation loops between steps 304 and 308 by applying additional program pulses until the Vt of each memory cell of the memory block 202 is at least PVT.

After the pre-program procedure is completed, operation advances to process 316 of the erase procedure. Process 316 can include defaulting the erase procedure to be performed on the entire memory block 202, i.e., full erase, as opposed to just a subset of the memory cells in memory block 202. Process 318 can include initializing the address to the first address in the memory block 202.

Process 320 can perform an erase (ERS) verify test for the memory cells of the memory block 202 to determine whether the memory block 202 meets an erase metric. While erase pulse is typically a bulk operation that will be applied to the entire memory block 202 or a subset of memory block 202, erase verify is typically performed on a per-page basis in which each page includes a selected number of memory cells or bits, such as 128 bits or the like. During the erase verify test, the Vt of each of the memory cells can be compared with an erase verify threshold (EVT) voltage (representing the erase metric for each of the memory cells). If the Vt of any memory cell of the memory block 202 is above the EVT voltage, for example 3.5V, the operation proceeds to process 322, which determines whether the current erase pulse is a selected interim pulse. The interim pulse number is predetermined for a specific NVM technology. For example, in one NVM technology, the pwell voltage during erase procedure will ramp from 4.2v to 8.5v with 140 mV increment per erase pulse. At the 20th pulse, the voltage applied to the pwell of the memory cells should be approximately 7 volts and it can be selected as the interim pulse. Accordingly, the selected interim pulse can be one at which the voltage is above a predetermined level for efficient erase procedures, but less than the maximum erase voltage to be applied.

If the current erase pulse is not the selected interim pulse, process 324 determines whether the maximum number of erase pulses has been applied. If the maximum number of erase pulses has not been applied, process 326 applies the next incremental erase pulse and control returns to process 320.

Referring back to process 322, if the current erase pulse is the selected interim pulse, process 328 can include performing an interim erase verify read of Vt on the first read page by the Vt monitor 211. If process 330 determines that all bits in the first read page have a Vt voltage that is lower than a specified voltage, for example, 5 volts, the verify read has passed and control is transferred to process 326 to apply the next incremental erase pulse. If process 330 determines that the verify read did not pass (i.e. not all bits in first read page are below the predetermined interim verify read Vt level), process 332 can enable erase procedures on subsets (e.g., halves) of the memory cells. The erase procedure then transfers from process 332 to process 326.

Referring back to process 320, if the erase verify passed on the selected read page or address (i.e., Vt of any memory cell of the selected read page in the memory block 202 is not above the EVT voltage), operation proceeds to process 336 to determine whether the last address has been erase verified. If the last address has not been erase verified, process 338 increments the address and transfers procedure to process 320. Procedure loops through processes 320 to 332 by applying additional erase pulses until the Vt of each memory cell of the memory block 202 is below EVT. If process 324 determines that the maximum number of erase pulses have been applied, process 334 indicates that the erase operation has failed.

The embodiment of erase procedure 300 shown in FIG. 3 is set up to handle a group of memory cells that has been divided into two subsets. Erase procedure 300 can be configured to handle more than two subsets to further manage the leakage by checking a greater number of interim erase pulses and interim verify read levels.

After the erase procedure is completed, the soft program procedure is initiated for the memory block 202 to place the Vt of the over-erased memory cells within the desired voltage range between the soft program verify voltage threshold (SPVT) and EVT. The soft program procedure is typically performed on a per-page basis in which each page includes a selected number of memory cells, such as 128 cells or the like. A soft program pulse may be applied to multiple memory cells at a time. In one embodiment, soft program pulses may be applied up to 36 memory cells at a time. The soft program pulse is typically not as strong as a program pulse, such as having a lower voltage, a shorter pulse duration, or a combination of both. The soft program procedure starts with process 318 which can include initializing the address to the first address in the memory block 202. Operation proceeds to process 342 to perform a soft program (SFT PGM) verify test, in which the Vt of each memory cell at the current address is compared with the SPVT voltage. If Vt of any memory cell at current address is below the SPVT voltage, operation proceeds to process 350 to determine whether the maximum number of soft program pulses have been applied. If the maximum number of soft program pulses has not been applied, operation proceeds to process 354 to apply a soft program pulse to memory cells which fail the soft program verify read at the current address. The soft program pulse has a selected voltage level and duration to increase Vt above SPVT while remaining below EVT. Procedure returns to process 342 to determine whether the Vt of each memory cell at current address is below SPVT, and procedure loops between steps 342 and 354 by applying additional soft program pulses until Vt of each memory cell of the memory block 202 is between the SPVT and EVT voltages.

If process 350 determines that the maximum number of soft program pulses have been applied, process 352 indicates that the erase operation has failed.

Referring to process 342, if the soft program verify procedure passed (i.e., Vt is greater than or equal to SPVT voltage), process 344 determines whether the last address has been soft program verified. If the last address has not been soft program verified, process 348 increments the address and returns procedure to process 342. Otherwise, if the last address has been soft program verified, procedure passes to process 346 to indicate that the erase operation has passed.

Figure 4:
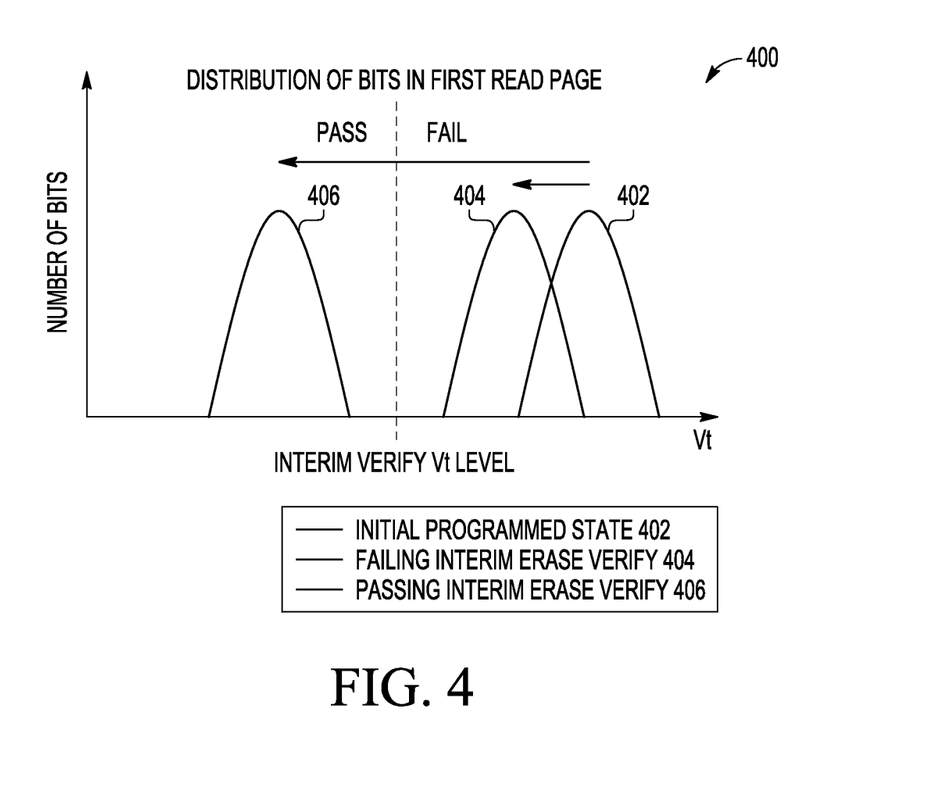
FIG. 4 is a graph of examples of voltage distribution curves of memory cells in a first read page during erase in the memory block controlled by the NVM controller of FIG. 2.

FIG. 4 is a graph 400 of examples of voltage distribution curves 402, 404, 406 of memory cells in a first read page in the memory block 202 controlled by the NVM controller 211 of FIG. 2. Graph 400 is labeled with Vt along the x-axis and the distribution of the number of bits or memory cells along the y-axis. A vertical dotted pass/fail line is shown bisecting the positive x-axis at an interim erase verify Vt voltage. Distribution curve 402 is an inverted parabola shape farthest to the right along the x-axis and represents all of the memory cells being in the programmed state. Distribution curve 404 is an inverted parabola shape between distribution curve 402 and the interim verify Vt voltage along the x-axis and represents all of the memory cells failing the interim erase verify read. Distribution curve 406 is an inverted parabola shape to the left of the interim verify Vt voltage along the positive x-axis and represents all of the memory cells passing the interim erase verify read.

At an interim predetermined point in the erase procedure it is expected that all bits in the first read page will have moved below an interim predefined verify Vt level if the charge pumps are not loaded down. If any bits in the first read page are not below this Vt level, the charge pumps maybe loaded down due to excessive device leakage.

Figure 5:
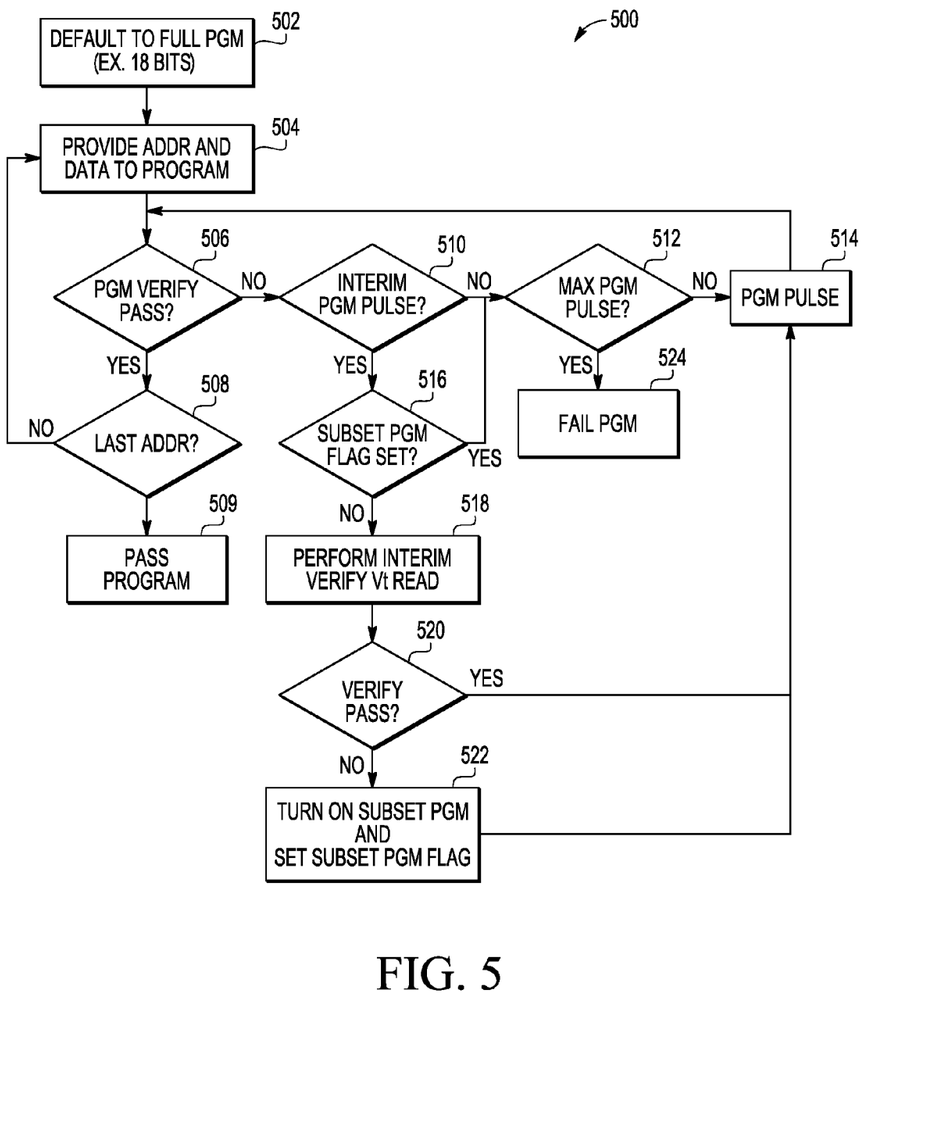
FIG. 5 is a flowchart diagram of an erase procedure generally controlled by the NVM controller of FIG. 2 in accordance with one embodiment for the memory block within the NVM array of FIG. 2.

FIG. 5 is a flowchart diagram of an embodiment of a method 500 for programming at least a portion of the memory block 202 generally executed and controlled by the NVM controller 207 of FIG. 2. Process 502 can include defaulting the program procedure to full program mode, as opposed to subset program mode in which a reduced number of the memory cells in memory block 202 are programmed in parallel. For example, full programming may operate on up to 18 memory cells at a time. A subset of the memory cells to be programmed can be 9, 6, 3 or other suitable number of memory cells. Process 504 can include providing the first memory cell address and the data to be written in the memory block 202 to NVM controller 207.

Process 506 can perform a program verify test for the current memory cell of the memory block 202 to determine whether the memory cell meets a program metric. During the program verify test, the Vt of each memory cell at the current address can be compared with a program verify threshold (PVT) voltage (representing the program metric). If the Vt of any of the memory cell at current address is below the PVT voltage, operation proceeds to process 510, which determines whether the current program pulse is a selected interim program pulse. The selected interim program pulse is a pulse that is less than the maximum number of pulses to be applied during the program procedure, but at or above the pulse number where a memory cell would typically meet the PVT during normal operation (i.e., without extensive leakage). For one example NVM technology, the interim program pulse can be 1 or 2 volts.

If the current program pulse is not the selected interim program pulse, process 512 determines whether the maximum number of program pulses has been applied. If the maximum number of program pulses has not been applied, process 514 applies the next program pulse and transfers to process 506.

Referring back to process 510, if the current program pulse is the selected interim program pulse, process 516 can include determining whether a subset program indicator has been set to indicate that the subset program mode has already been enabled due to degraded performance being detected while a previous memory address was being programmed. If the subset program indicator has been set, process 516 transfers control to process 512. If the subset program indicator has not been set, process 516 transfers control to process 518.

Process 518 can include performing an interim program verify read of Vt by the Vt monitor 211. If process 520 determines that the interim program verify Vt read has passed (i.e., all bits in the page being programmed have a Vt voltage that is higher than a specified voltage, for example, 5V), control is transferred to process 514 to apply the next program pulse. If process 520 determines that the verify Vt read did not pass, process 522 can enable subset program mode and set the subset program indicator that can be used to skip the same checking for the following addresses to improve program performance.

Referring back to process 506, if the program verify passed (i.e., Vt of the memory cell is above the PVT voltage), operation proceeds to process 508 to determine whether the last address has been programmed. If the last address has been programmed, process 509 indicates that the programming operation for the group of memory cells has passed. If the last address has not been programmed, process 508 transfers operation to process 504. Operation loops through processes 504 to 514 by applying additional program pulses until the Vt of each memory cell of the memory block 202 is at least PVT.

The embodiment of program procedure 500 shown in FIG. 5 is set up to handle a group of memory cells that has been divided into two subsets. Program procedure 500 can be configured to handle more than two subsets by checking a greater number of interim program pulses and drain bias voltages, and using additional subset program flags.

Figure 6:
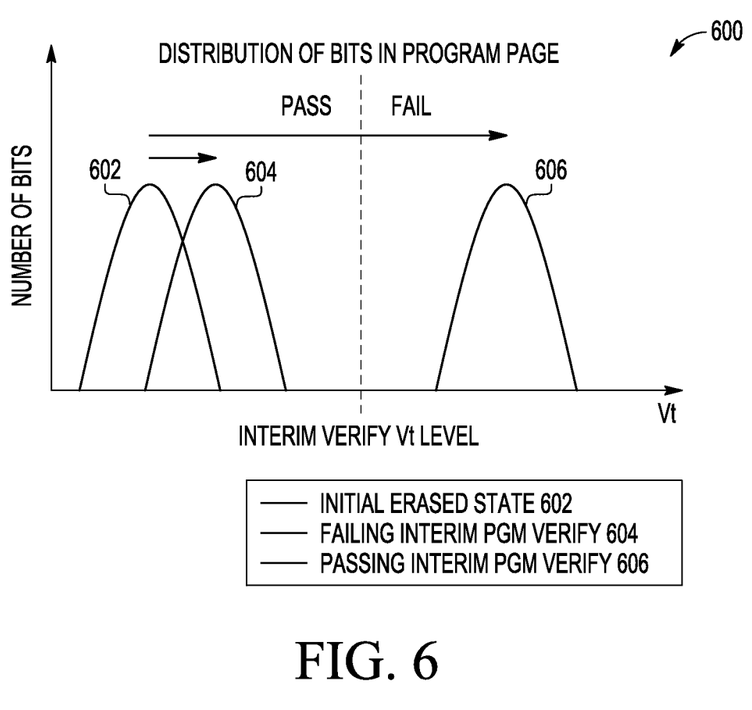
FIG. 6 is a graph of examples of voltage distribution curves of memory cells in a program page during program in the memory block controlled by the NVM controller of FIG. 2.

FIG. 6 is a graph 600 of examples of voltage distribution curves 602, 604, 606 of memory cells in a first program page in the memory block 202 controlled by the NVM controller 211 of FIG. 2. Graph 600 is labeled with Vt along the x-axis and the distribution of the number of bits or memory cells along the y-axis. A vertical dotted pass/fail line is shown bisecting the positive x-axis at an interim program verify Vt voltage. Distribution curve 602 is an inverted parabola shape farthest to the left along the positive x-axis and represents all of the memory cells being in an initial erased state. Distribution curve 604 is an inverted parabola shape between distribution curve 602 and the interim verify Vt voltage along the x-axis and represents all of the memory cells failing the interim program verify read. Distribution curve 606 is an inverted parabola shape to the right of the interim verify Vt voltage along the x-axis and represents all of the memory cells passing the interim program verify read.

At an interim predetermined point in the program procedure it is expected that all bits in the first read page will have moved above an interim predefined verify Vt level if the charge pumps are not loaded down. If any bits in the first read page are not above this Vt level, the charge pumps maybe loaded down due to excessive device leakage.

Figure 7:
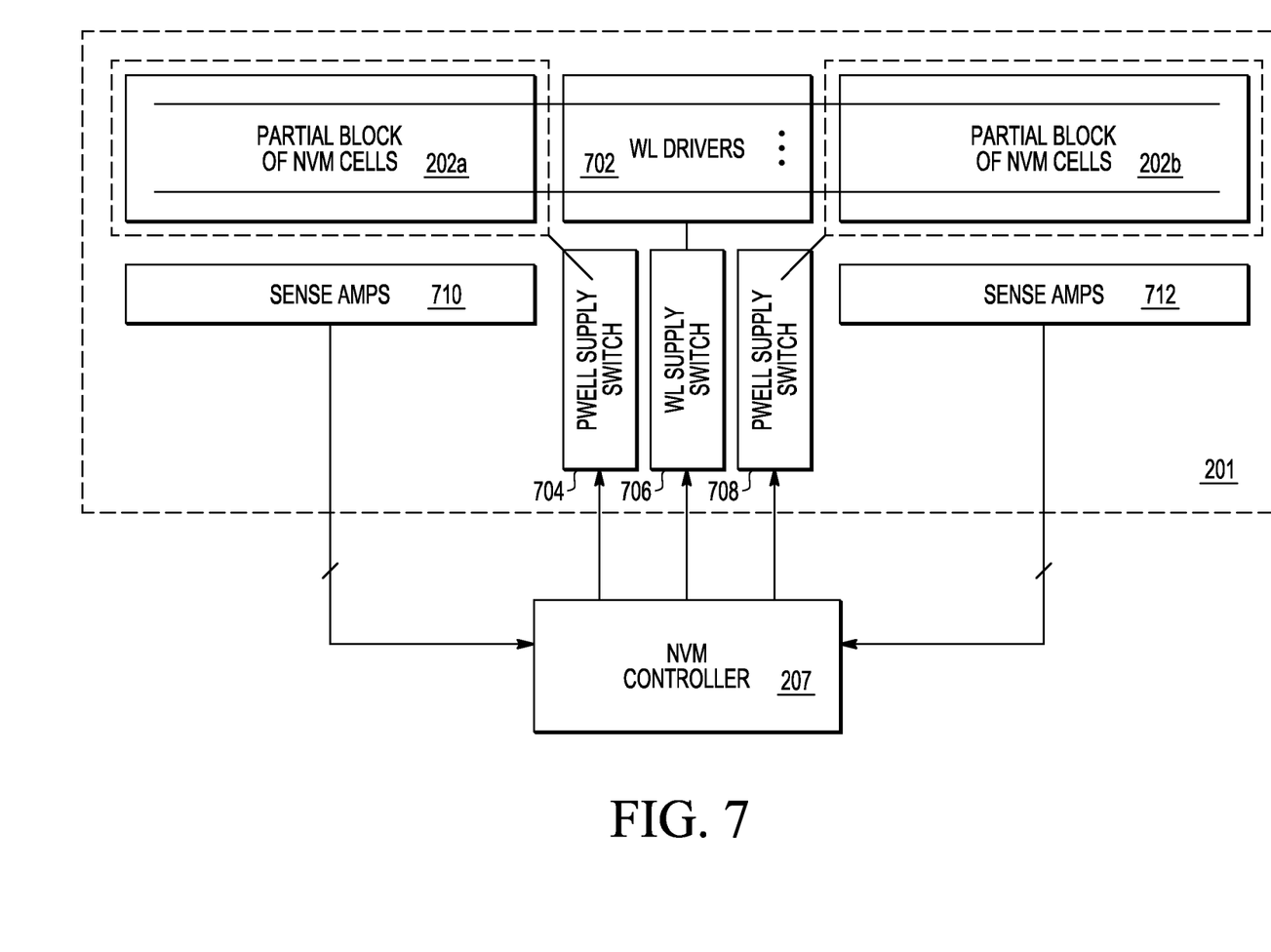
FIG. 7 is a block diagram of an example of an architecture for a memory block that can be used in the NVM of FIG. 1 to provide partial or full program/erase capability.

FIG. 7 is a block diagram of an example of an architecture for memory block 202 that can be used in the NVM 103 of FIG. 1 to provide partial or full erase capability. Memory block 202 of FIG. 2 is shown in two sections 202a, 202b, with each NVM section 202a, 202b including a partial amount of the memory cells (202a and 202b can be identical to 225 and 227 in FIG. 2 with each being half of the block). Word line (WL) drivers 702 are coupled between the NVM sections 202a, 202b. A first pwell supply switch 704 is coupled between NVM controller 207 and first NVM section 202a and a second pwell supply switch 708 is coupled between NVM controller 207 and the second NVM section 202b. A word line supply switch 706 is coupled between word line drivers 702 and NVM controller 207. A first sense amplifier 710 is coupled between NVM controller 207 and first NVM section 202a and a second sense amplifier 712 is coupled between NVM controller 207 and the second NVM section 202b to provide sense amplifier signals from NVM sections 202a, 202b to NVM controller 207. NVM controller 207 operates pwell supply switches 704, 708, and word line supply switch 706 to control whether erase/program signals are provided to respective NVM sections 202a, 202b. The operation of pwell supply switches 704, 708 is controlled by the erase parallelism control logic 215 (FIG. 2).

A commercially available microcontroller that utilizes the partial erase capability shown in FIG. 7 is the Coral microcontroller (Part #: MPC5534) available from Freescale Semiconductor, Inc. in Austin, Tex.

By now it should be appreciated that systems and methods have been disclosed that adaptively adjust the program/erase parallelism by monitoring the memory cell Vt movement during program and erase operation. That is, when the memory cells moved too slow (due to charge pumps loaded down by device leakage) and failed an interim verify Vt check, the number of bits to be programmed and erased in parallel will be reduced. This will reduce the load to the charge pumps when needed and hence reduce the leakage to overcome. The ability to adaptively adjust the number of memory cells being programmed or erased in parallel also allows components to be used in higher temperature environments with minimum performance impact across all temperatures and improves the reliability of the components at beginning and end of useful life of the component.

In some embodiments, a method of performing a write operation on memory cells of a memory array to a first logic state using a voltage of a charge pump comprises performing a portion of the write operation on the memory cells of the memory array using the voltage of the charge pump; determining if the voltage is insufficient for performing the write operation on the memory cells of the memory array; and if a level of the voltage is insufficient, continuing the write operation with an increased level of the voltage by reducing load on the charge pump by providing the voltage on a reduced number of memory cells, wherein the reduced number of memory cells is a first subset of the memory cells.

In another aspect, the performing the write operation comprises performing a program procedure.

In another aspect, the memory cells are arranged in a plurality of pages, wherein each page has a plurality of the memory cells, wherein the determining comprises testing the plurality of memory cells of a first page of the plurality of pages and if the plurality of memory cells of the first page do not obtain a predetermined level of programming, the voltage level is determined to be insufficient.

In another aspect, the performing the portion of the write operation comprises performing an erase procedure.

In another aspect, the performing the portion of the write operation is further characterized by the write operation comprising one of a group consisting of a soft programming procedure and a pre-programming procedure.

In another aspect, the write operation further comprises completing the write operation on the first subset of the memory cells using the voltage, and performing the write operation on a second subset of the memory cells using the voltage.

In another aspect, the determining if the voltage is insufficient comprises testing at a least a portion of the memory cells to see if sufficient progress has been made for a duration of the write operation that has occurred.

In another aspect, the testing comprises determining if a first threshold voltage has been achieved for the portion of the memory cells.

In another aspect, the performing a portion of the write operation comprises beginning an erase procedure, and the method further comprises after continuing the write operation, determining if the voltage being used on the first subset of memory cells is insufficient for performing the write operation on the first subset memory cells; and if the voltage being used on the first subset of memory cells is insufficient, continuing the write operation using the voltage of the charge pump on a second subset of the memory cells, wherein the second subset is a subset of the first subset.

In another aspect, the method further comprises completing erasing the second subset of memory cells; and completing erasing the memory cells by sequentially erasing groups of memory cells, wherein each group has a same number of memory cells as the second subset.

In another aspect, the write operation further comprises pre-programming the memory cells prior to beginning the erase procedure; and soft programming selected memory cells after the completing the erasing of the memory cells.

In another embodiment, a method of performing a write operation on memory cells of a memory array to a first logic state using a voltage of a charge pump comprises performing a portion of the write operation on the memory cells of the memory array using the voltage of the charge pump; determining if the memory cells are providing an excessive load on the charge pump by testing at least a portion of the memory cells to see if sufficient writing has occurred; and if the load is excessive, continuing the write operation on a decreased number of the memory cells, wherein the decreased number of the memory cells comprise a subset of the memory cells.

In another aspect, the testing comprises detecting if a predetermined threshold voltage has been reached by the memory cells.

In another aspect, the write operation comprises a program operation.

In another aspect, the write operation comprises an erase operation.

In another aspect, continuing the write operation comprises completing an erase procedure.

In another aspect, continuing the writing operation comprises performing a portion of an erase procedure; determining if the first subset of memory cells are providing an excessive load on the charge pump by testing at least a portion of the first subset of memory cells to see if sufficient writing has occurred; and if the load of the first subset of memory cells is excessive, continuing the erase procedure on a decreased number of the memory cells relative to the first subset, wherein the decreased number of the memory cells relative to the first subset comprise a subset of the first subset of memory cells.

In another aspect, the method further comprises completing the erase procedure on the second subset; dividing the memory cells, less the second subset of memory cells, into groups of equal size and equal to the second subset; and sequentially performing the erase procedure on the groups.

In another embodiment, a non-volatile memory system comprises an array of memory cells that are non-volatile; charge pumps that have outputs that provide voltages; and a controller that causes the outputs to be coupled to the memory cells to perform a write to a first logic state on the memory cells, determines if loading by the memory cells results in insufficient writing, and if insufficient writing occurs when the output is coupled to the memory cells, then the output is coupled to a first subset of the memory cells to reduce loading on the output and thereby raising a level of the voltage.

In another aspect, the controller determines if the loading by the memory results in insufficient writing by determining if threshold voltages of memory cells has failed to reach a predetermined level.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of systems disclosed herein are circuitry located on a single integrated circuit or within a same device. Alternatively, the systems may include any number of separate integrated circuits or separate devices interconnected with each other. Also for example, a system or portions thereof may be soft or code representations of physical circuitry or of logical representations convertible into physical circuitry. As such, a system may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the present disclosure has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present disclosure without departing from the spirit and scope of the disclosure as defined by the appended claims.

What is claimed is:

1. A method of performing a write operation on memory cells of a memory array to a first logic state using a voltage of a charge pump, the method comprising:
   performing a portion of the write operation on the memory cells of the memory array using the voltage of the charge pump;
   determining if the voltage is insufficient for performing the write operation on the memory cells of the memory array; and
   if a level of the voltage is insufficient, continuing the write operation with an increased level of the voltage by reducing load on the charge pump by providing the voltage on a reduced number of memory cells, wherein the reduced number of memory cells is a first subset of the memory cells.

2. The method of claim 1, wherein the performing the write operation comprises performing a program procedure.

3. The method of claim 2, wherein the memory cells are arranged in a plurality of pages, wherein each page has a plurality of the memory cells, wherein the determining comprises testing the plurality of memory cells of a first page of the plurality of pages and if the plurality of memory cells of the first page do not obtain a predetermined level of programming, the voltage level is determined to be insufficient.

4. The method of claim 1, wherein the performing the portion of the write operation comprises performing an erase procedure.

5. The method of claim 1, wherein the performing the portion of the write operation is further characterized by the write operation comprising one of a group consisting of a soft programming procedure and a pre-programming procedure.

6. The method of claim 1, wherein the write operation further comprises:
   completing the write operation on the first subset of the memory cells using the voltage, and
   performing the write operation on a second subset of the memory cells using the voltage.

7. The method of claim 6, wherein the determining if the voltage is insufficient comprises testing at a least a portion of the memory cells to see if sufficient progress has been made for a duration of the write operation that has occurred.

8. The method of claim 7, wherein the testing comprises determining if a first threshold voltage has been achieved for the portion of the memory cells.

9. The method of claim 1, wherein the performing a portion of the write operation comprises beginning an erase procedure, further comprising:
   after continuing the write operation, determining if the voltage being used on the first subset of memory cells is insufficient for performing the write operation on the first subset memory cells; and
   if the voltage being used on the first subset of memory cells is insufficient, continuing the write operation using the voltage of the charge pump on a second subset of the memory cells, wherein the second subset is a subset of the first subset.

10. The method of claim 9, further comprising:
    completing erasing the second subset of memory cells; and completing erasing the memory cells by sequentially erasing groups of memory cells, wherein each group has a same number of memory cells as the second subset.

11. The method of claim 10, wherein the write operation further comprises:
pre-programming the memory cells prior to beginning the erase procedure; and
soft programming selected memory cells after the completing the erasing of the memory cells.

12. A method of performing a write operation on memory cells of a memory array to a first logic state using a voltage of a charge pump, the method comprising:
performing a portion of the write operation on the memory cells of the memory array using the voltage of the charge pump;
determining if the memory cells are providing an excessive load on the charge pump by testing at least a portion of the memory cells to see if sufficient writing has occurred; and
if the load is excessive, continuing the write operation on a decreased number of the memory cells, wherein the decreased number of the memory cells comprise a subset of the memory cells.

13. The method of claim 12, wherein the testing comprises detecting if a predetermined threshold voltage has been reached by the memory cells.

14. The method of claim 13, wherein the write operation comprises a program operation.

15. The method of claim 13, wherein the write operation comprises an erase operation.

16. The method of claim 15, wherein continuing the write operation comprises completing an erase procedure.

17. The method of claim 15, wherein continuing the writing operation comprises:
performing a portion of an erase procedure;
determining if the first subset of memory cells are providing an excessive load on the charge pump by testing at least a portion of the first subset of memory cells to see if sufficient writing has occurred; and
if the load of the first subset of memory cells is excessive, continuing the erase procedure on a decreased number of the memory cells relative to the first subset, wherein the decreased number of the memory cells relative to the first subset comprise a subset of the first subset of memory cells.

18. The method of claim 17, further comprising:
completing the erase procedure on the second subset;
dividing the memory cells, less the second subset of memory cells, into groups of equal size and equal to the second subset; and
sequentially performing the erase procedure on the groups.

19. A non-volatile memory system, comprising:
an array of memory cells that are non-volatile;
charge pumps that have outputs that provide voltages; and
a controller that causes the outputs to be coupled to the memory cells to perform a write to a first logic state on the memory cells, determines if loading by the memory cells results in insufficient writing, and if insufficient writing occurs when the output is coupled to the memory cells, then the output is coupled to a first subset of the memory cells to reduce loading on the output and thereby raising a level of the voltage.

20. The non-volatile memory system of claim 19, wherein the controller determines if the loading by the memory results in insufficient writing by determining if threshold voltages of memory cells has failed to reach a predetermined level.

* * * * *